(12) United States Patent  
Mayer (10) Patent No.: US 9,001,510 B2  
(45) Date of Patent: Apr. 7, 2015

(54) SYSTEM AND METHOD FOR POSITIONING A MIDPLANE WITHIN A COMPUTER CHASSIS

(75) Inventor: Dave Mayer, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 994 days.

(21) Appl. No.: 12/694,887

(22) Filed: Jan. 27, 2010

(65) Prior Publication Data

US 2011/0182030 A1   Jul. 28, 2011

(51) Int. Cl.
  H05K 5/00   (2006.01)
  H05K 7/00   (2006.01)
  A47B 96/00  (2006.01)
  G06F 1/18   (2006.01)
  H05K 7/14   (2006.01)

(52) U.S. Cl.
  CPC .............. G06F 1/184 (2013.01); G06F 1/183 (2013.01); H05K 7/1488 (2013.01)

(58) Field of Classification Search
  USPC ................. 361/679.57–679.6, 732, 796–804, 361/826–829; 312/223.1, 223.2, 223.3; 248/298.1, 274.1, 122.1
  See application file for complete search history.

(56) References Cited

U.S. PATENT DOCUMENTS

| 7,857,145 | B2 * | 12/2010 | Mushan et al. | 211/26 |
| 2004/0164208 | A1 * | 8/2004 | Nielson et al. | 248/49 |
| 2005/0146855 | A1 * | 7/2005 | Brehm et al. | 361/724 |

* cited by examiner

Primary Examiner — Jerry Wu  
(74) Attorney, Agent, or Firm — Conley Rose, P.C.

(57) ABSTRACT

System and method for positioning a midplane within a computer chassis. In some embodiments, a computer system includes a chassis, a midplane disposed within the chassis, and a plunger pin coupled to the midplane. The plunger pin is selectably movable between a first position, wherein the midplane is immovable relative to the chassis, and a second position, wherein the midplane is moveable relative to the chassis.

20 Claims, 13 Drawing Sheets

SYSTEM AND METHOD FOR POSITIONING A MIDPLANE WITHIN A COMPUTER CHASSIS

BACKGROUND

Some servers have an outer chassis and a midplane board (or simply a "midplane") supported therein. Processor cards and input/output (I/O) cards are connected to and extend from both sides of the midplane within the chassis. Typically these servers also include other components, such as power supply units and cooling fans, coupled to either or both sides of the midplane.

Precise positioning and fixturing of the midplane within the chassis enables reliable coupling of components to both sides of the midplane. Once so connected, minimized movement of the midplane promotes continued engagement of the components with the midplane. In the event that repair of the midplane becomes necessary, removal of the midplane from the chassis, servicing, and replacement may be required. During these operations, the server is unavailable. Moreover, servicing of the server and access to the midplane can be cumbersome.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect, direct, optical or wireless electrical connection. Thus, if a first device couples to a second device, that connection may be through a direct electrical connection, through an indirect electrical connection via other devices and connections, through an optical electrical connection, or through a wireless electrical connection.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1A:
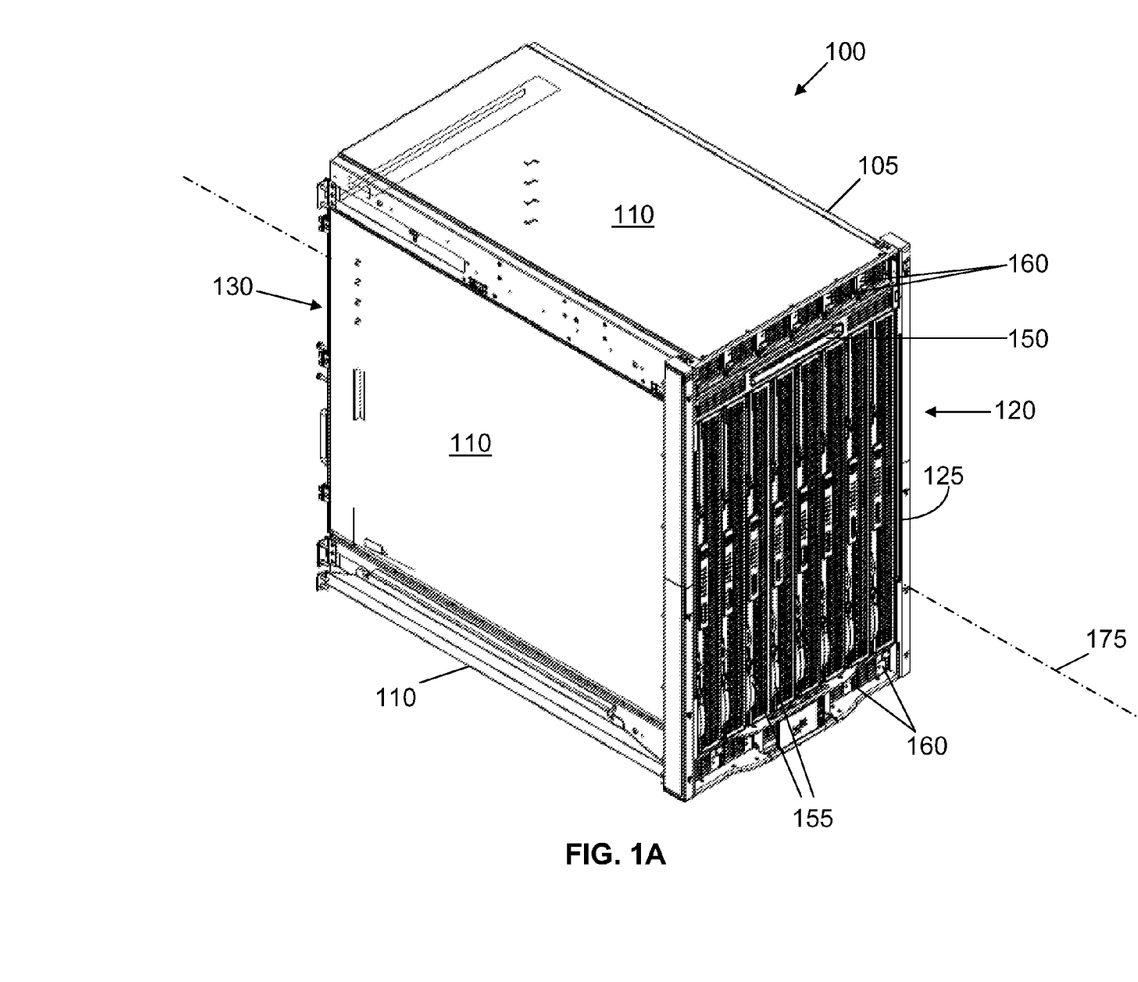
FIGS. 1A and 1B show perspective front and rear views, respectively, of a computer in accordance with the invention.
Figure 1B:
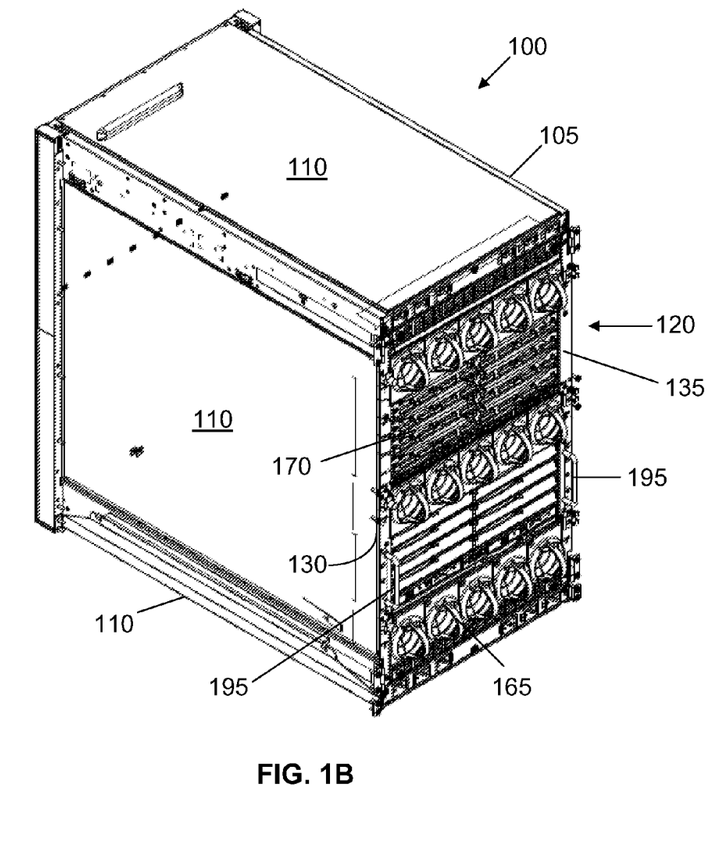

FIGS. 1A and 1B show perspective front and rear views, respectively, of a computer, such as but not limited to a server, in accordance with the invention. Computer 100 has a chassis or housing 105. In this embodiment, computer chassis 105 is a generally rectangular structure with four sides 110 bounding an interior chamber 115 (FIG. 5A), in which other components of computer 100, generally designated 120, are disposed. Computer chassis 105 further includes an open-ended front 125 and an open-ended rear 130, both enabling access to interior chamber 115 and components 120 disposed therein.

Figure 2A:
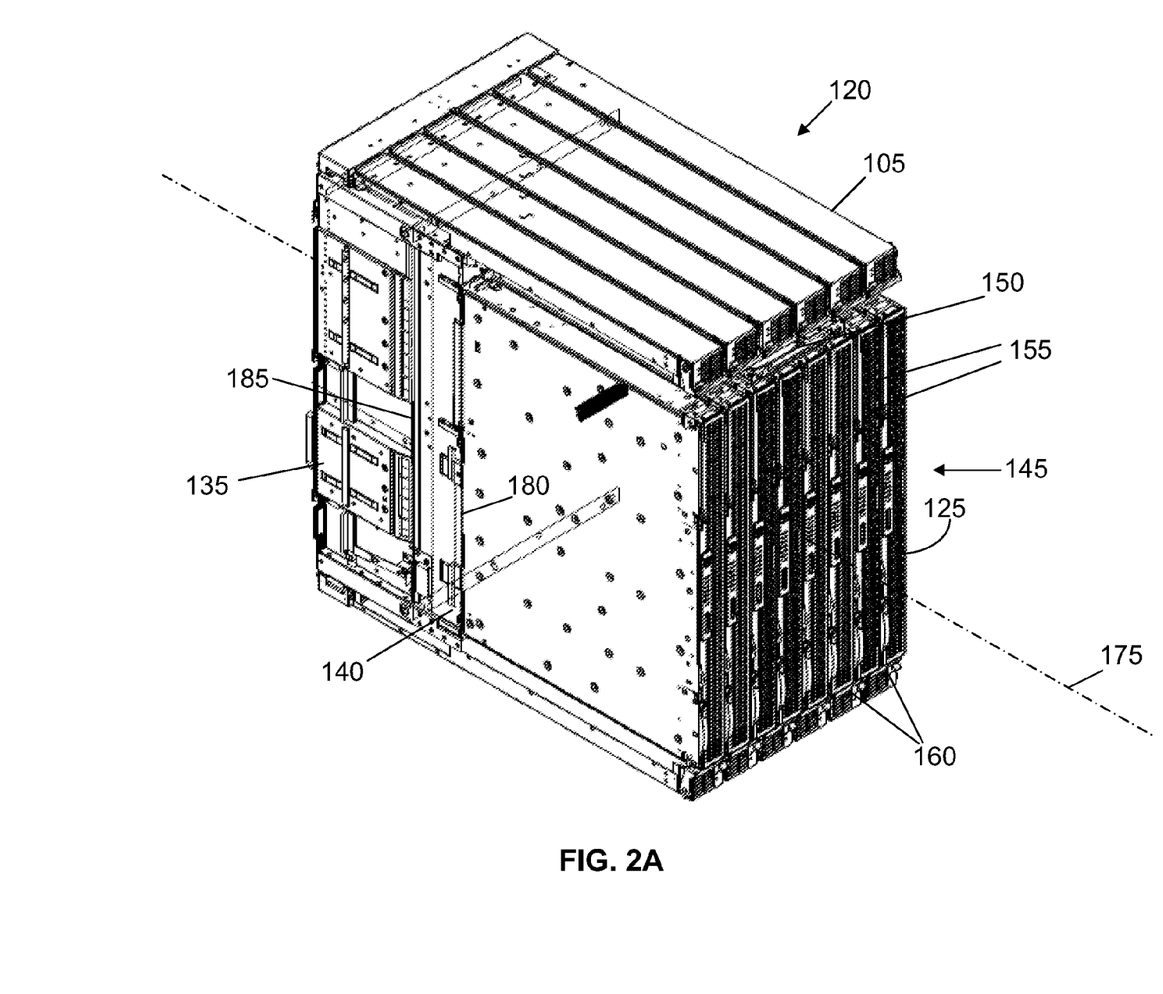
FIGS. 2A and 2B show perspective front and rear views, respectively, of the computer of FIG. 1 with the sides of the chassis removed, exposing to view the blades, midplane, and I/O chassis.
Figure 2B:
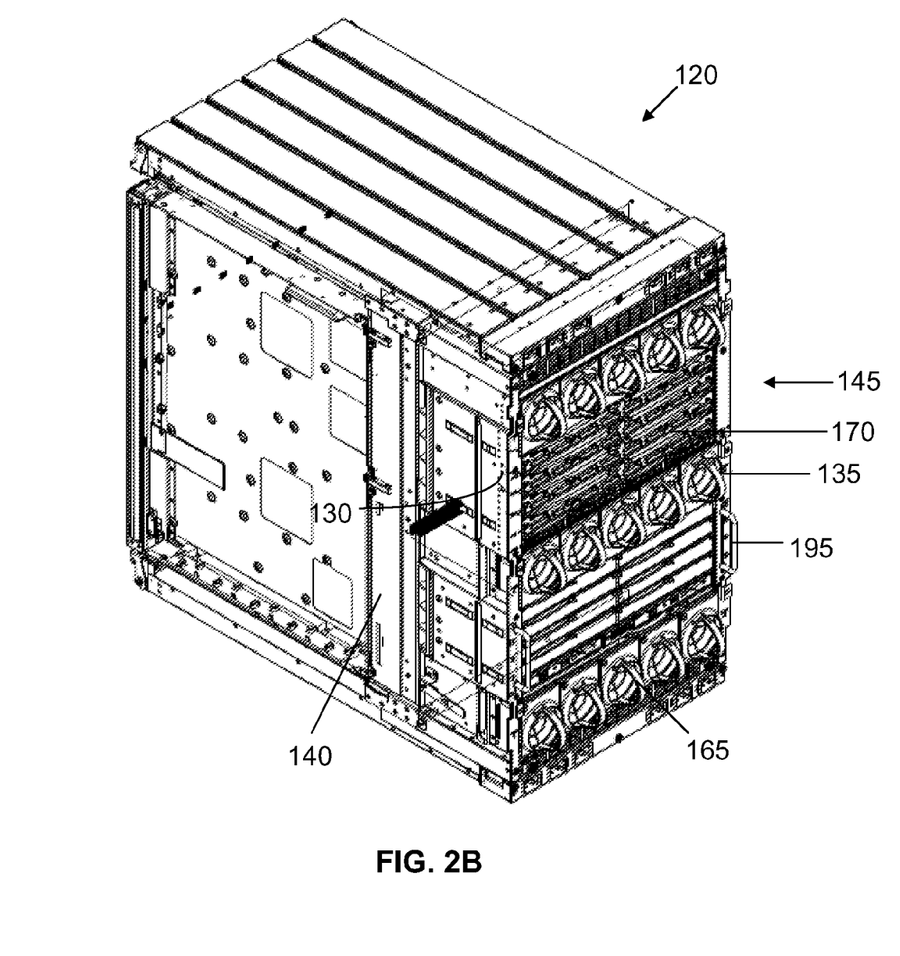

Turning to FIGS. 2A and 2B, computer 100 is shown with sides 110 of chassis 105 removed, thereby exposing the other computer components 120 to view. As shown, computer 100 further includes an I/O chassis 135, a midplane board ("midplane") 140, and a plurality of components coupled to midplane 140 and generally designated 145. In this embodiment, components 145 coupled to midplane 140 include a digital versatile disc (DVD) assembly 150, a plurality of blades 155, bulk power supply (BPS) units 160, fan assemblies 165, and switches or I/O cards 170.

Midplane 140 extends substantially normal to a longitudinal centerline 175 of computer chassis 105 and is releasably coupled thereto, as will be described. Midplane 140 enables communication between blades 155 and I/O cards 170 coupled thereto and distribution of power from BPS units 160 to blades 155, I/O cards 170, DVD assembly 150, and fan assemblies 165. Midplane 140 has a front side 180 and a back side 185 with a plurality of connectors 190 (visible in FIG. 3A) coupled to and extending from each. Connectors 190 enable coupling of components 145 to midplane 140.

Each of blades 155 extends substantially parallel to computer chassis axis 175 from front side 180 of midplane 140 to front 125 of chassis 105. In some embodiments, each blade 150 includes a motherboard having one or more central processing units (CPUs) and memory for data storage. In this embodiment, computer 100 includes eight blades 155.

I/O chassis 135 is disposed adjacent back side 185 of midplane 140 and extends between midplane 140 and rear 130 of computer chassis 105. I/O chassis 135 receives and supports fan assemblies 165 and I/O cards 170, enabling the coupling of these components 165, 170 to midplane 140. As one of ordinary skill in the art readily appreciates, fan assemblies 165 provide cooling to blades 155, DVD assembly 150, BPS units 160, and I/O cards 170. I/O chassis 135 includes two handles 195 that enable installation of I/O chassis 135 into computer chassis 105 and removal of I/O chassis 135 from computer chassis 105.

Because the various components 145 described above couple to both sides 180, 185 of midplane 140, precise positioning of midplane 140 within computer chassis 105 is required. To facilitate precise positioning of midplane 140 within computer chassis 105, midplane 140 further includes a plurality of plunger pins 200, best viewed in FIGS. 3A and 3B. As will be described, plunger pins 200 are manually actuatable to interlock midplane 140 within computer chassis 105.

Figure 3A:
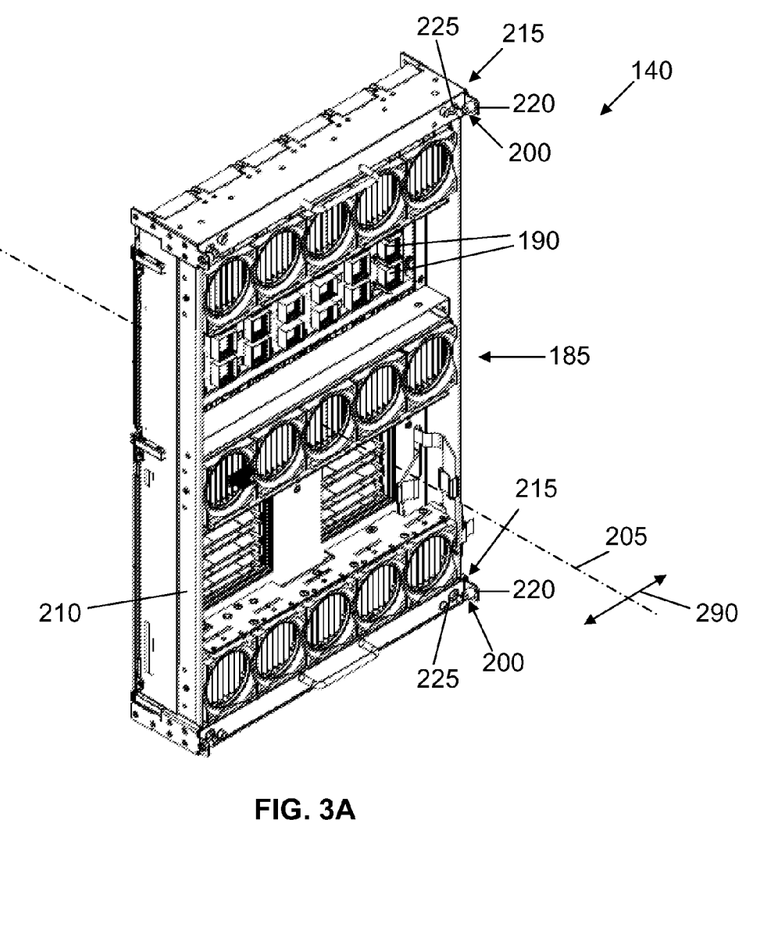
FIGS. 3A and 3B show perspective rear and enlarged rear views, respectively, of the midplane of the computer of FIG. 1.

FIGS. 3A and 3B depict perspective rear and enlarged rear views, respectively, of midplane 140. Referring first to FIG. 3A, the exemplary embodiment of midplane 140 has a longitudinal centerline 205 and a housing 210 disposed about its back side 185. When midplane 140 is installed within computer chassis 105, as illustrated by FIGS. 1A and 1B, midplane centerline 205 and computer chassis centerline 175 are coincident. Referring still to FIG. 3A, housing 210 is substantially rectangular in shape and thus has four corners 215. At each corner 215, midplane housing 210 has a flanged portion or extension 220. Midplane 140 further includes a plunger pin 200 coupled to flanged portion 220 and an internal embossment 225 disposed on back side 185 of midplane 140 proximate the plunger pin 200.

Figure 3B:
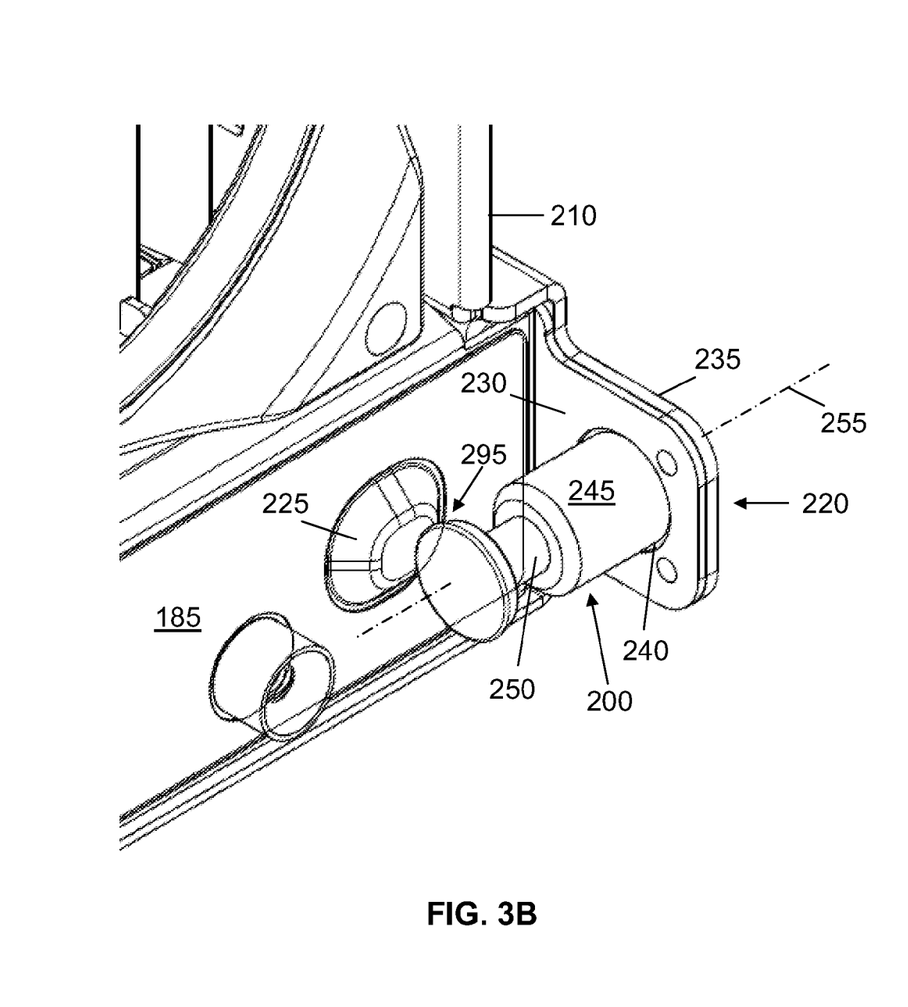

As best viewed in FIG. 3B, flanged portion 220 extends from midplane housing 210 substantially parallel to midplane centerline 205 (FIG. 3A). Flanged portion 220 has an interior surface 230, an exterior surface 235, and a throughbore 240 extending therebetween. Plunger pin 200 is coupled within throughbore 240 to flanged portion 220.

In some embodiments, plunger pin 200 has an outer housing 245, a pin member 250 extending therethrough, and a central axis 255. Pin housing 245 enables coupling of plunger pin 200 to flanged portion 220 of midplane housing 210. In some embodiments, an end of pin housing 245 is received within throughbore 240 of flanged portion 220 of midplane housing 210. Central axis 255 of plunger pin 200 is substantially normal to midplane centerline 205 (FIG. 3A) and is thus normal to computer chassis centerline 175 when midplane 140 is installed within computer chassis 105.

Figure 4A:
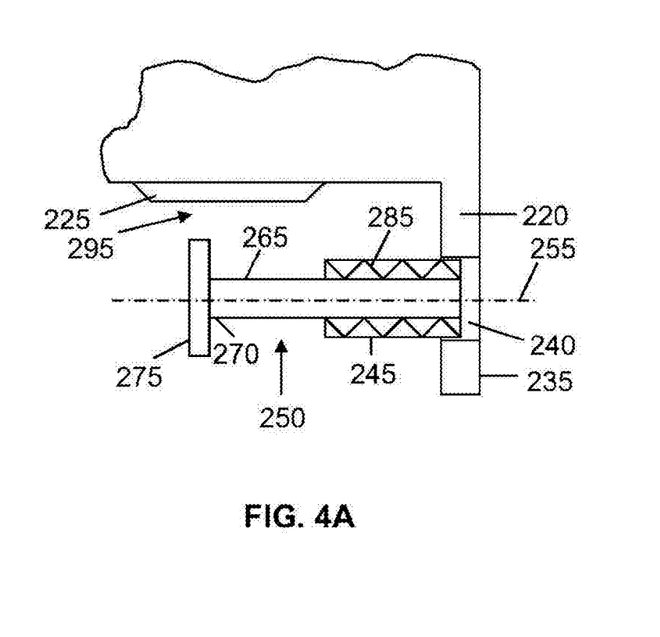
FIGS. 4A and 4B are cross-sectional views of one plunger pin in its retracted and extended positions, respectively.
Figure 4B:
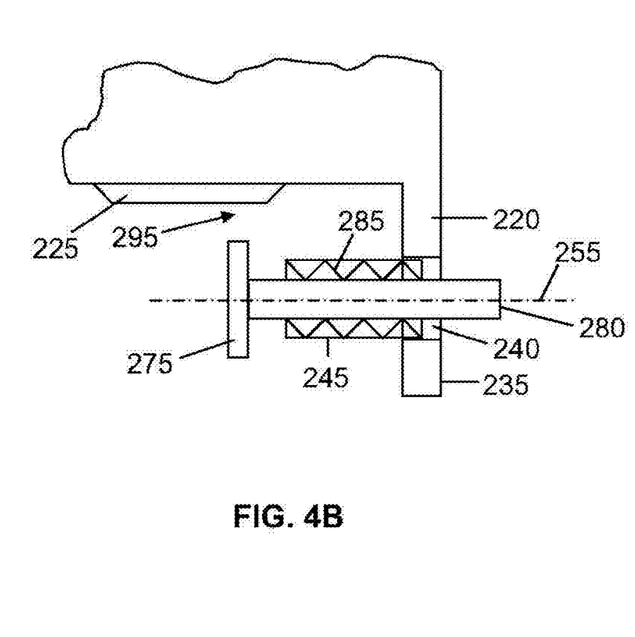

Turning to FIGS. 4A and 4B, pin member 250 has an elongate body 265 extending between an inner end 270 with a flanged head 275 and an outer end 280. Pin member 250 is translatable relative to pin housing 245 along central axis 255 between a retracted position, illustrated by FIG. 4A, and an extended position, illustrated by FIG. 4B. In the extended position (FIG. 4B), end 280 of pin member 250 extends beyond exterior surface 235 of flanged portion 220. In the retracted position (FIG. 4A), the opposite is true, meaning end 280 does not extend beyond exterior surface 235.

In some embodiments, plunger pin 200 is spring-loaded, having a spring 285 disposed within pin housing 245 about pin member 250. Further, in some such embodiments, pin member 250 is biased by spring 285 to its extended position (FIG. 4B). Hence, in the absence of a tension load, pin member 250 assumes its extended position. When a tension load is applied to head 275 of pin member 250 in excess of the biasing force of spring 285, pin member 250 is displaced toward its retracted position (FIG. 4A). Once retracted, removal of the applied tension load allows pin member 250 to return to its extended position (FIG. 4B) under force from spring 285. Thus, application and removal of tension to head 275 enables translation of pin member 250 between its retracted and extended positions, respectively.

Still further, in some embodiments, pin member 250 is operable to lock in its retracted position (FIG. 4A) such that when an applied tension load is removed, pin member 250 is prevented from returning to its extended position. In such embodiments, pin member 250 is also rotatable relative to pin housing 245 about central axis 255. As before, when a tension load is applied to head 275 of pin member 250 exceeding the biasing spring force, pin member 250 is displaced to its retracted position (FIG. 4A). Once in the retracted position, pin member 250 is then rotated relative to pin housing 245 into a locked position. When in the locked position, pin member 250 is constrained from translating relative to pin housing 245 in a direction toward flanged portion 220 of midplane housing 210, even when the applied tension load is removed.

To return pin member 250 to its extended position (FIG. 4B) from a locked, retracted position, pin member 250 is again rotated relative to pin housing 245 but in the opposite direction from the locked position to an unlocked position. Once in the unlocked position, pin member 250 is free to translate relative to pin housing 245 when the applied tension load is removed. Thus, in this manner, pin member 250 is translatable between extended and retracted positions and rotatable between unlocked and locked positions.

Referring again to FIG. 3B, internal embossment 225 protects plunger pin 200. Internal embossment 225 is a protrusion coupled to, or formed in, back side 185 of midplane 140. At least a portion of internal embossment 225 is laterally aligned with head 275 of plunger pin 200, wherein the lateral direction 290 (FIG. 3A) is normal to midplane centerline 205. Internal embossment 225 extends from back side 185 toward plunger pin 200, leaving some clearance 295 (see also FIG. 4A) between embossment 225 and plunger pin 200. In the event that a load is applied to pin member 250, for example, due to inadvertent contact with other computer components 145 during assembly, head 275 of pin member 250 will displace and engage internal embossment 225. Internal embossment 225 subsequently supports pin member 250 in resisting the applied load and prevents pin member 250 from breaking. Clearance 295 is selected such that embossment 225 does not interfere with actuation of plunger pin 200, and pin member 250, when inadvertently contacted, displaces to engage and be supported by embossment 225 prior to breaking.

Figure 5A:
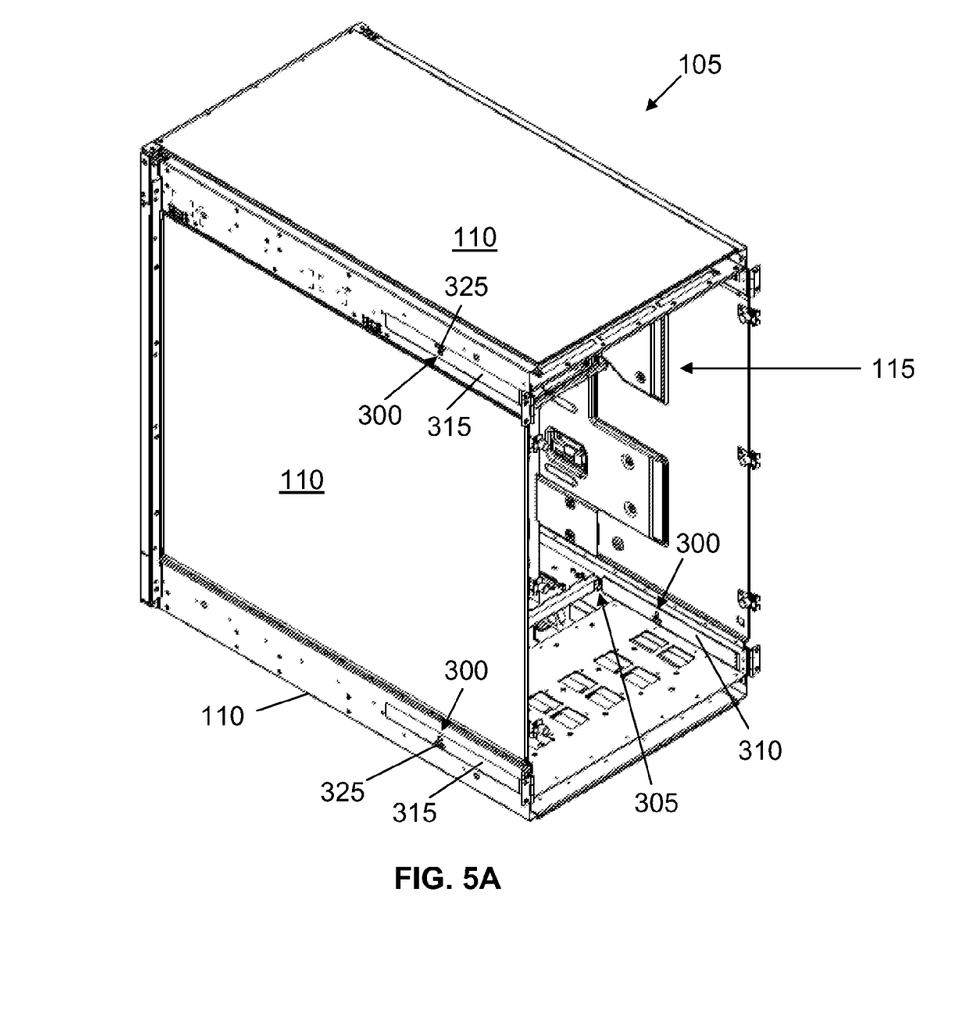
FIGS. 5A through 5C are perspective, enlarged exterior, and enlarged interior views, respectively, of the computer chassis.
Figure 5B:
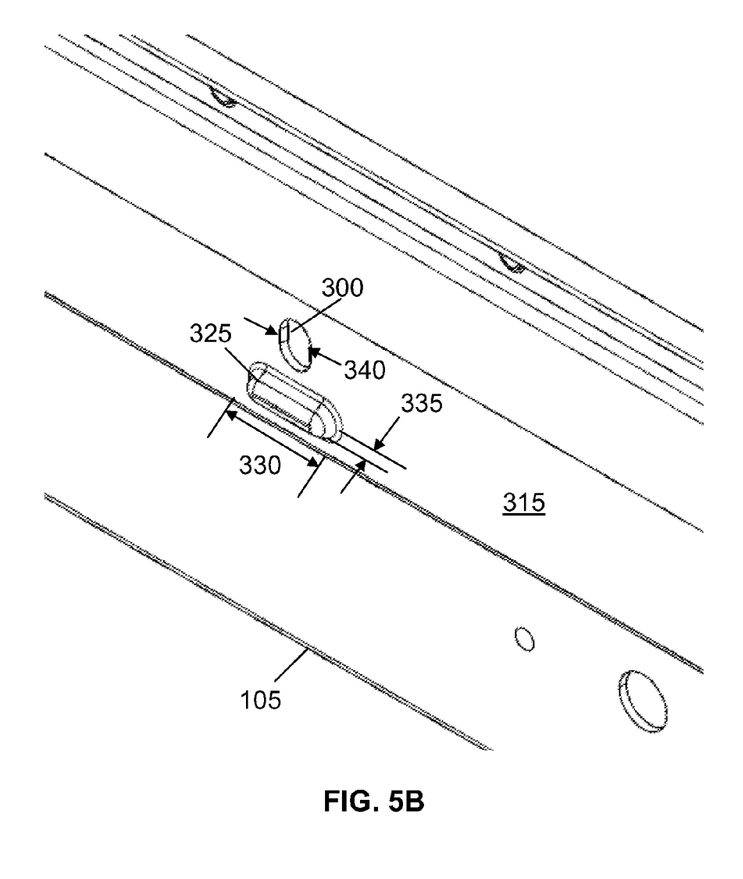
Figure 5C:
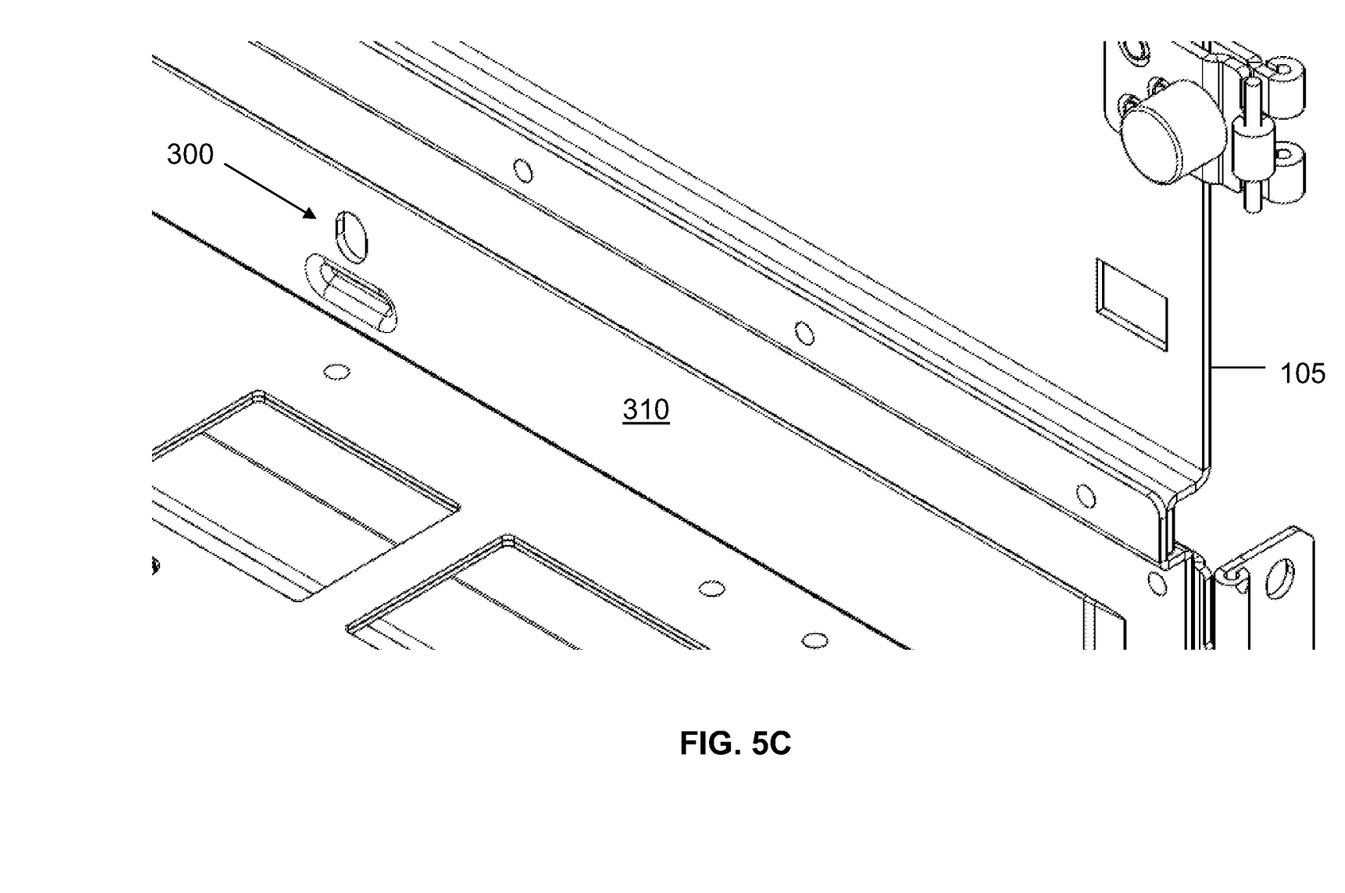

Turning now to FIGS. 5A through 5C, computer chassis 105 further includes a plurality of cutouts 300 and a plurality of stop pins 305. In this embodiment, there are an equal number of cutouts 300 and plunger pins 200. Each cutout 300 extends from between an interior surface 310 and an exterior surface 315 of computer chassis 105 and is shaped to receive end 280 of one plunger pin 200. Each stop pin 305 extends substantially normally from interior surface 310 of computer chassis 105 and has a length sufficient to engage midplane 140 when midplane 140 inserted into chassis 105.

Figure 6A:
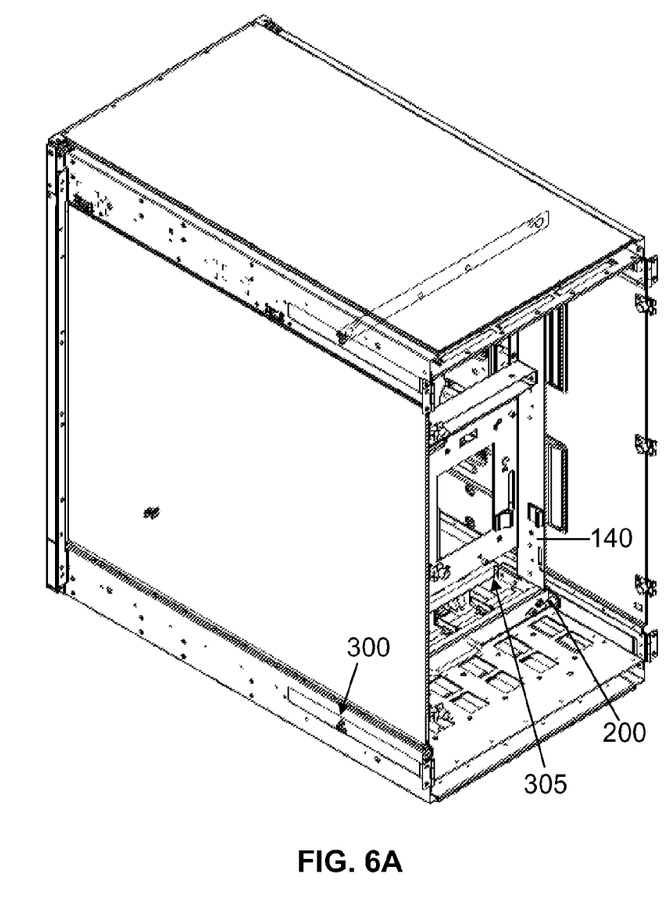
FIGS. 6A and 6B are perspective and enlarged interior views, respectively, of the computer chassis, illustrating engagement of the midplane with the chassis.
Figure 6B:
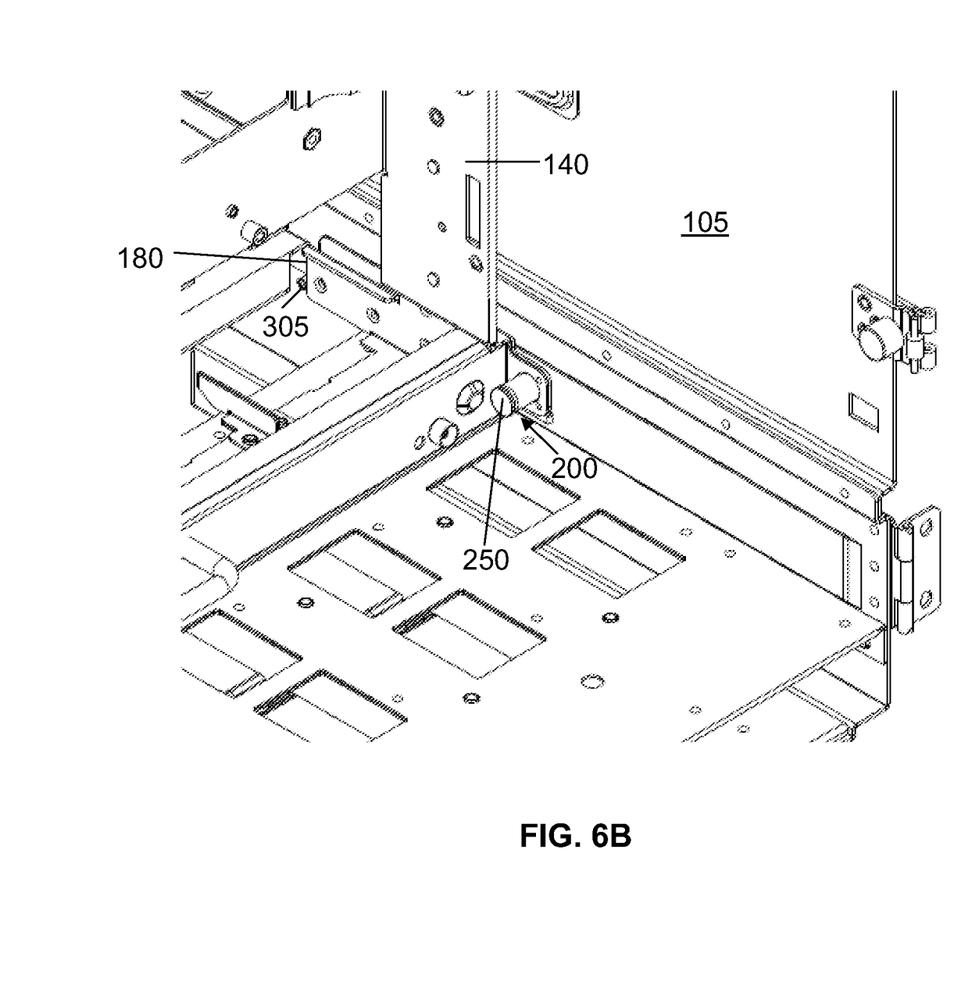

The positioning and number of cutouts 300 and stop pins 305 are such that when midplane 140 is inserted within chassis 105, front side 180 of midplane 140 abuts stop pins 305 when plunger pins 200 align with cutouts 300 in chassis 105, as illustrated by FIGS. 6A and 6B. Stop pins 305 prevent further insertion of midplane 140 into chassis 105. With plunger pins 200 aligned with cutouts 300, pin members 250 of plunger pins 200 are then manually actuated to displace pin members 250 to their extended positions, thereby causing end 280 of each pin member 250 to be received within an aligned cutout 300. When ends 280 of pin members 250 are received within cutouts 300, midplane 140 is interlocked within computer chassis 105 and immovable relative to computer chassis 105.

As used herein, the term "immovable" means midplane 140 does not move relative to chassis 105 but for small relative displacement resulting from clearance between the inner surface of chassis 105 defining each cutout 300 and the outer surface of pin member 250 inserted therein. Such clearances are a function of the tolerances of cutout and pin member dimensions and enable pin members 250 to be received within cutouts 300. But for the small relative movement or "play" permitted by these clearances, midplane 140 does not move relative to chassis 105 when interlocked via plunger pins 200 and cutouts 300. Furthermore, in some embodiments, midplane 140 does not move at all relative to chassis 105 once interlocked with chassis 105.

Referring again to FIGS. 5A and 5B, computer chassis 105 further includes an external embossment 325 extending from exterior surface 315 of chassis 105 proximate each cutout 300. External embossments 325 protect plunger pins 200 when midplane 140 is interlocked with computer chassis 105. Each external embossment 325 is axially aligned, defined relative to computer centerline 175 (FIG. 1A), with the proximal cutout 300, and has an axial length 330 and a height 335 defined relative to exterior surface 315 of computer chassis 105. The axial length 330 of each external embossment 325 exceeds the axial width 340 of the proximal cutout 300.

As previously described and illustrated by FIG. 6B, ends 280 of pin members 250 of plunger pins 200 extend through cutouts 300 of computer chassis 105 when midplane 140 is interlocked within computer chassis 105. Height 335 of each external embossment 325 is selected such that it exceeds the length of the portion of pin member 250 that extends from cutout 300 when midplane 140 is interlocked within computer chassis 105. Thus, external embossment 325 bears the brunt of inadvertent loads to computer 100 in this region rather than pin member 250 extending from cutout 300.

Figure 7:
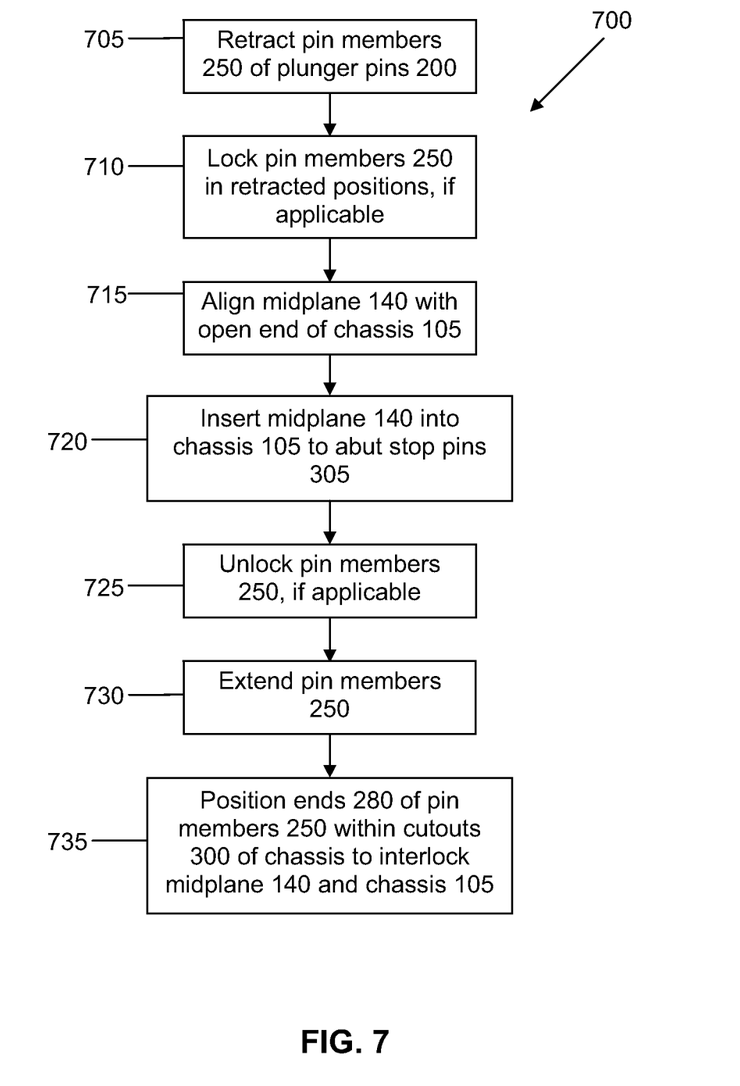
FIG. 7 is a flowchart illustrating an exemplary method for positioning the midplane within the computer chassis in accordance with the invention.

Turning finally to FIG. 7, a flowchart is depicted illustrating an exemplary method 700 for positioning midplane 140 within computer chassis 105. As illustrated, plunger pins 200 are actuated by application of a tension load to each pin member 250, thereby causing pin members 250 to translate relative to outer housings 245 to their retracted positions (FIG. 4A). (Block 705) In embodiments wherein plunger pins 200 are spring-loaded and pin members 250 are biased toward their extended positions (FIG. 4B) by springs 285, translation of pin members 250 toward their retracted positions compresses springs 285. Further, in embodiments wherein pin members 250 may be locked in their retracted positions, pin members 250 are then rotated relative to outer housings 245, thereby locking pin members 250 in their retracted positions and preventing them from translating relative to outer housings 245 when the applied tension loads are removed. (Block 710).

Next, midplane 140 is aligned with an open end of computer chassis 105 (block 715) and then inserted into chassis 105 until abutting stop pins 305 (block 720). When midplane 140 abuts stop pins 305, midplane 140 is positioned in the desired location relative to chassis 105, such that components 145 may be subsequently coupled to midplane 140, and plunger pins 200 are aligned with cutouts 300 in computer chassis 105.

To interlock midplane 140 within chassis 105, pin members 250 are rotated in a direction opposite that described above with reference to block 710 to unlock pin members 250, if applicable. (Block 725) After pin members 250 are unlocked and tension loads applied to pin members 250 are removed, springs 285 within plunger pins 200 expand to translate pin members 250 from their retracted positions to their extended positions (block 730) with ends 280 of pin members 250 received within cutouts 300 of chassis 105 (block 735). When ends 280 of pin members 250 are received within cutouts 300 of chassis 105, midplane 140 is interlocked within chassis 105 and prevented from movement relative to chassis 105.

The method of positioning midplane 140 within computer chassis 105 described above and illustrated by FIG. 7 is but one example for interlocking midplane 140 within chassis 105 in accordance with the invention. In other embodiments, at least some of the steps described above and shown in FIG. 7 may be performed in a different order. For example, midplane 140 may be aligned with an open end of computer chassis 105 and pin members 250 retracted subsequent to such alignment.

Appropriate positioning of cutouts 300, stop pins 305, and plunger pins 200 enables precise positioning of midplane 140 within computer chassis 105. After components 145 are disposed within computer chassis 105 and coupled to midplane 140, plunger pins 200 engaged with computer chassis 105 prevent midplane 140 from moving and inadvertently decoupling from one or more components 145. Furthermore, because plunger pins 200 are manually actuated to extend to engage computer chassis 105 during assembly and to retract to disengage chassis 105 during disassembly, servicing of midplane 140 is facilitated, enabling less downtime of computer 100 for repair and/or replacement of midplane 140 when needed.

The above discussion is meant to be illustrative of the principles and various embodiments of the present invention. Numerous variations and modifications will become apparent to those skilled in the art once the above disclosure is fully appreciated. For example, the number and positioning of plunger pins, stop pins, and cutouts may vary. It is intended that the following claims be interpreted to embrace all such variations and modifications.

What is claimed is:

1. A computer system comprising:
   a chassis;
   a midplane removably disposed within the chassis, the midplane comprising a plurality of connectors configured to directly couple to a plurality of components; and
   at least one plunger pin coupled to the midplane and selectably movable between a first position, wherein the midplane is immovable relative to the chassis, and a second position, wherein the midplane is moveable relative to the chassis.

2. The computer system of claim 1, wherein the chassis comprises a cutout extending between an interior surface of the chassis and an exterior surface of the chassis and configured to receive an end of the plunger pin.

3. The computer system of claim 2, wherein when the plunger pin is in the first position, the end of the plunger pin extends beyond the exterior surface of the chassis and wherein when the plunger pin is in the second position, no portion of the plunger pin extends beyond the exterior surface.

4. The computer system of claim 1, wherein the plunger pin comprises a spring biasing the plunger pin toward the first position.

5. The computer system of claim 1, wherein the plunger pin comprises a housing and a pin member extending therethrough, the pin translatable relative to the housing between the first position and the second position.

6. The computer system of claim 5, wherein the plunger pin further comprises a spring disposed between the housing and the pin member, the spring biasing the pin member to the first position.

7. The computer system of claim 5, wherein the plunger pin is rotatable relative to the housing between a locked position, wherein the plunger pin is prevented from translation relative to the housing, and an unlocked position, wherein the plunger pin is translatable relative to the housing.

8. The computer system of claim 2, further comprising an external embossment extending from the exterior surface of the chassis and aligned with the cutout, wherein the external embossment has a width exceeding a width of the cutout and a height exceeding any length of the plunger pin extending through the cutout.

9. The computer system of claim 1, further comprising a stop pin extending from an interior surface of the chassis and limiting insertion of the midplane into the chassis.

10. The computer system of claim 9, wherein the plunger pin is aligned with a cutout in the chassis configured to receive an end of the plunger pin when the midplane abuts the stop pin.

11. The computer system of claim 1, wherein the midplane comprises an embossment proximal the plunger pin with a clearance therebetween, the clearance selected to enable engagement between the embossment and the plunger pin prior to the plunger pin breaking when under load.

12. A method of positioning a midplane within a computer chassis, the method comprising:
 retracting a plunger pin coupled to the midplane;
 positioning the midplane within the computer chassis; and
 extending the plunger pin through the computer chassis, whereby the midplane is interlocked within the computer chassis and immovable relative to the computer chassis.

13. The method of claim 12, wherein the positioning the midplane comprises:
 aligning the midplane with an open end of the computer chassis;
 inserting the midplane into the computer chassis; and
 abutting the midplane against a stop pin extending from an interior surface of the computer chassis.

14. The method of claim 12, wherein the retracting the plunger pin comprises:
 applying a tension load to a pin member of the plunger pin, the pin member translatably disposed within a housing of the plunger pin coupled to the midplane; and
 translating the pin member relative to the housing, whereby a spring disposed between the pin member and the housing is compressed.

15. The method of claim 14, wherein the extending of the plunger pin comprises:
 removing the tension load to the pin member; and
 expanding the spring, whereby the pin member translates relative to the housing to interlock with the computer chassis.

16. The method of claim 12, further comprising:
 locking the plunger pin when retracted, whereby the plunger pin is prevented from extending; and
 unlocking the plunger pin after said positioning to enable said extending.

17. A computer system comprising:
 a computer chassis;
 a midplane disposed within the computer chassis;
 means for limiting insertion of the midplane into the computer chassis; and
 means for releasably coupling the midplane to the computer chassis, said means for releasably coupling actuatable to prevent movement of the midplane relative to the computer chassis when the midplane engages said means for limiting insertion of the midplane into the computer chassis.

18. The computer system of claim 17, wherein said means for releasably coupling comprises:
 means for supporting a pin member coupled to the midplane; and
 means for moving the pin member relative said means for supporting; and
 means for receiving a portion of the pin member, said means for receiving on the computer chassis.

19. The computer system of claim 18, wherein the pin member aligns with said means for receiving when the midplane engages said means for limiting insertion of the midplane into the computer chassis.

20. The computer system of claim 18, wherein the pin member is rotatable between a locked position, wherein the pin member is prevented from moving into said means for receiving, and an unlocked position, wherein the pin member is free to move into said means for receiving.

* * * * *